(12) United States Patent
Chen

(10) Patent No.: US 8,704,579 B2
(45) Date of Patent: Apr. 22, 2014

(54) LEVEL SHIFTING CIRCUIT AND SEMICONDUCTOR DEVICE USING THE SAME

(75) Inventor: Chung-Hui Chen, Hsinchu (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 6 days.

(21) Appl. No.: 13/341,380

(22) Filed: Dec. 30, 2011

(65) Prior Publication Data
US 2013/0169339 A1    Jul. 4, 2013

(51) Int. Cl.
*H03L 5/00*    (2006.01)

(52) U.S. Cl.
USPC ............ 327/333; 327/112; 326/68; 326/81

(58) Field of Classification Search
USPC ............ 327/112, 333, 427; 326/68, 80, 81; 365/189.11
See application file for complete search history.

(56) References Cited

U.S. PATENT DOCUMENTS

| | | | |
|---|---|---|---|
| 6,232,794 B1* | 5/2001 | Cox | 326/81 |
| 7,629,830 B1* | 12/2009 | Rubin | 327/333 |
| 7,855,590 B2* | 12/2010 | Kanno et al. | 327/333 |

* cited by examiner

*Primary Examiner* — Long Nguyen
(74) *Attorney, Agent, or Firm* — Lowe Hauptman & Ham, LLP

(57) ABSTRACT

A level shifting circuit includes a first circuit, a second circuit and an output voltage controlling circuit. The first circuit is coupled to an input node, an output node and a first supply voltage node and configured to pull an output voltage at the output node toward the first supply voltage in accordance with an input voltage applied to the input node. The second circuit is coupled to the first circuit, the output node and the second supply voltage node and configured to pull the output voltage toward the second supply voltage in accordance with the input voltage from the first circuit. The output voltage controlling circuit is coupled to the output node and configured to control the output voltage within a range narrower than a range from the first voltage to the second voltage.

20 Claims, 9 Drawing Sheets

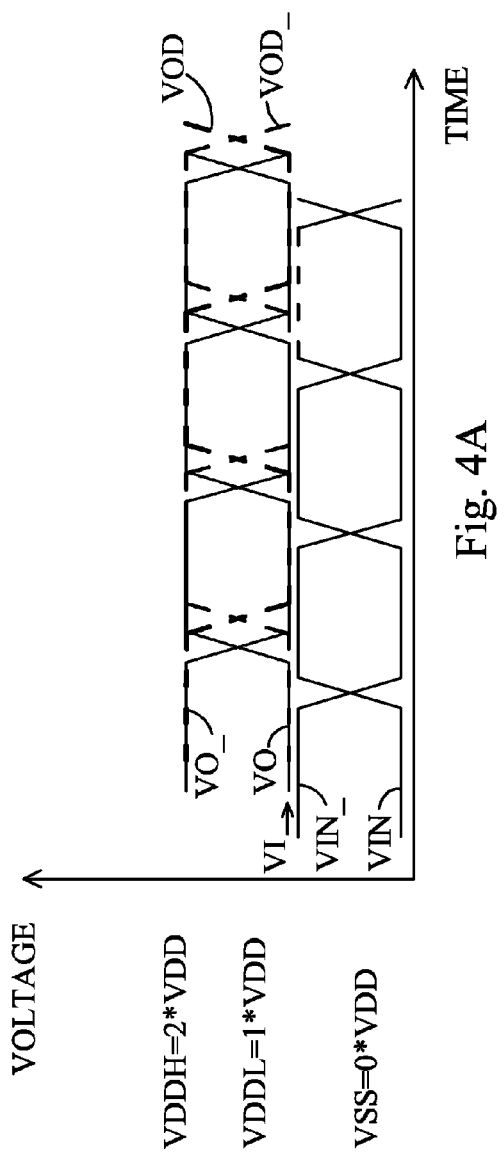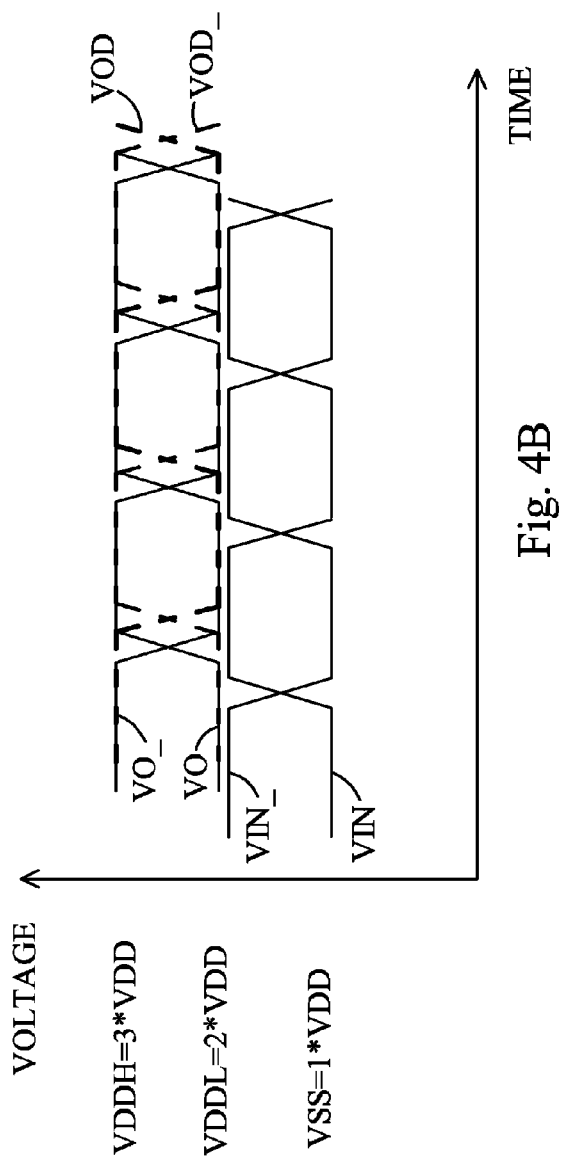

US 8,704,579 B2

LEVEL SHIFTING CIRCUIT AND SEMICONDUCTOR DEVICE USING THE SAME

BACKGROUND

Level shifting circuits are generally used as input/output (I/O) circuitry for transferring signals between electronic devices that have different operating voltages. For example, on the one hand, a level up-shifting circuit is used to shift the signals from a low voltage range of one circuit to a high voltage range of another circuit. On the other hand, a level down-shifting circuit is used to shift the signals from a high voltage range of one circuit to a low voltage range of another circuit.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 4A-4B are various timing diagrams of voltages at certain nodes in level up-shifting circuits in accordance with some embodiments.

DETAILED DESCRIPTION

Figure 1:
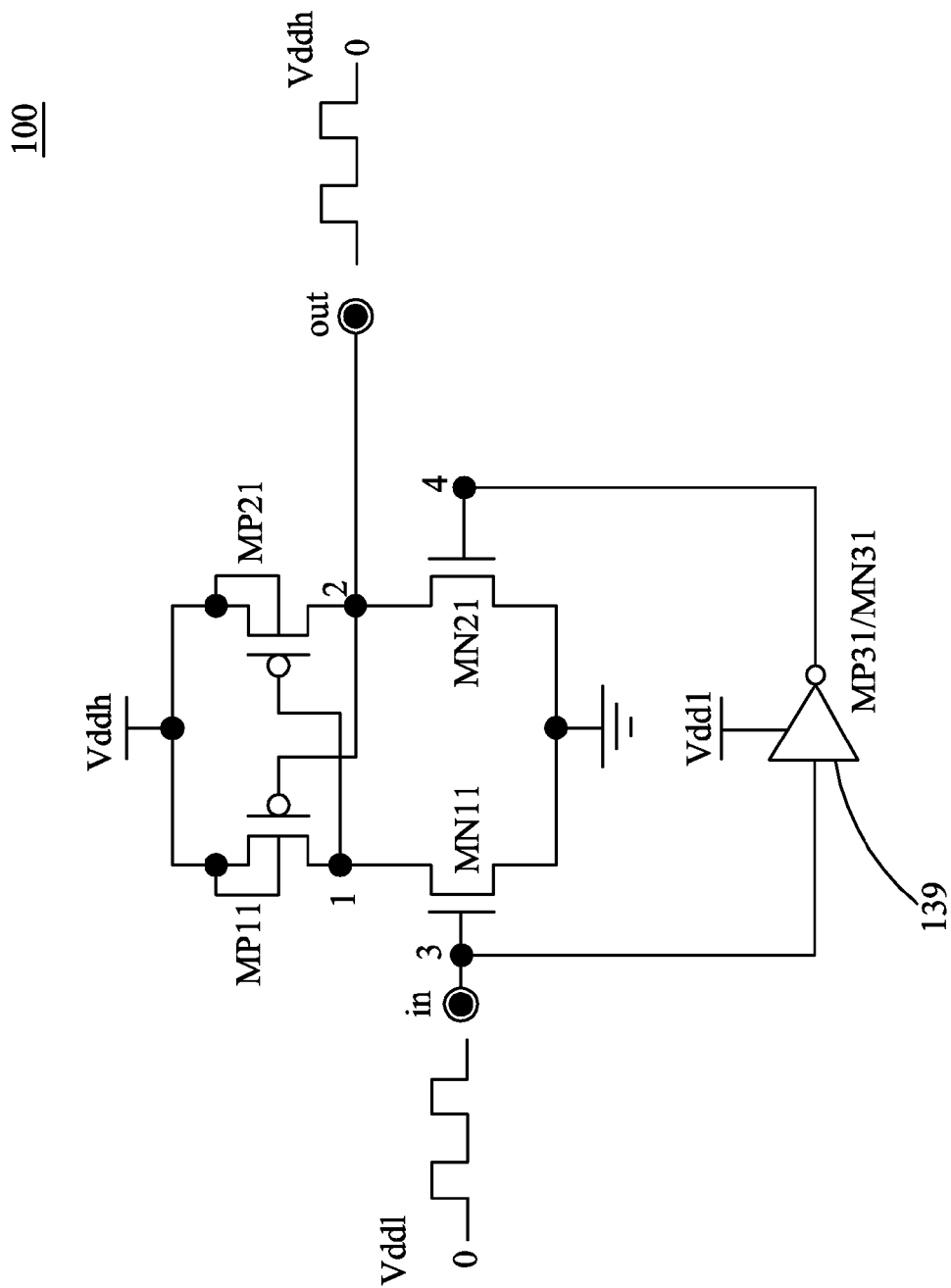
FIG. 1 is a schematic circuit diagram of a level shifting circuit.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic circuit diagram of a level shifting circuit 100. The level shifting circuit 100 includes n-channel metal-oxide semiconductor (NMOS) transistors MN11, MN21, and p-channel metal-oxide semiconductor (PMOS) transistors MP11, MP21. The sources of the NMOS transistors MN11, MN21 are coupled to the ground. The drains of the NMOS transistors MN11, MN21 are coupled to corresponding output nodes 1, 2. The gates of the NMOS transistors MN11, MN21 are coupled to corresponding input nodes 3, 4. The sources of the PMOS transistors MP11, MP21 are coupled to a high supply voltage source Vddh. The drains of the PMOS transistors MP11, MP21 are coupled to the corresponding output nodes 1, 2. The PMOS transistors MP11, MP21 are cross-latched, with the gate of the PMOS transistor MP11 connected to the drain of the PMOS transistor MP21 and the gate of the PMOS transistor MP21 connected to the drain of the PMOS transistor MP11.

A core circuit 139, including, for example, a NMOS transistor MN31 and a PMOS transistor MP31, is coupled to the input nodes 3, 4 of the level shifting circuit 100. The core circuit 139 is coupled to a low supply voltage source Vdd1. The core circuit 139 generates a signal having a voltage level which swings between the ground voltage (i.e., zero) and the low supply voltage source Vdd1. The signal generated by the core circuit 139 is supplied to the level shifting circuit 100 via the input node 3. An inverted version of the signal generated by the core circuit 139 is supplied to the level shifting circuit 100 via the input node 4.

When the signal changes from the ground voltage to the low supply voltage source Vdd1 at the input node 3, the NMOS transistor MN11 is turned ON and pulls an output voltage at the output node 1 to the ground voltage. As a result, the PMOS transistor MP21 is turned ON and pulls an output voltage at the output node 2 to the high supply voltage source Vddh. The PMOS transistor MP11 is turned OFF by the high voltage at the output node 2. The NMOS transistor MN21 is turned OFF by the ground voltage of the inverted signal at the input node 4. The process is reversed when the signal changes from the low supply voltage source Vdd1 to the ground voltage at the input node 3.

As a result, the output voltages at the output nodes 1, 2 swing between the ground voltage (i.e., zero) and the high supply voltage source Vddh, i.e., within a voltage range greater than that of the signal generated by the core circuit 139. The greater voltage range is applied across the NMOS transistors MN11, MN21 and PMOS transistors MP11, MP21 of the level shifting circuit 100 and, under certain circumstances, is likely to cause gate oxide breakdown in one or more of the NMOS and PMOS transistors of the level shifting circuit 100. To avoid or minimize the likelihood of such breakdown, the gate oxide of the NMOS and PMOS transistors of the level shifting circuit 100 is made thicker than the gate oxide of the NMOS and PMOS transistors of the core circuit 139. As the thickness of the gate oxide of the NMOS and PMOS transistors increases, the switching speed of the NMOS and PMOS transistors decreases.

Figure 2A:
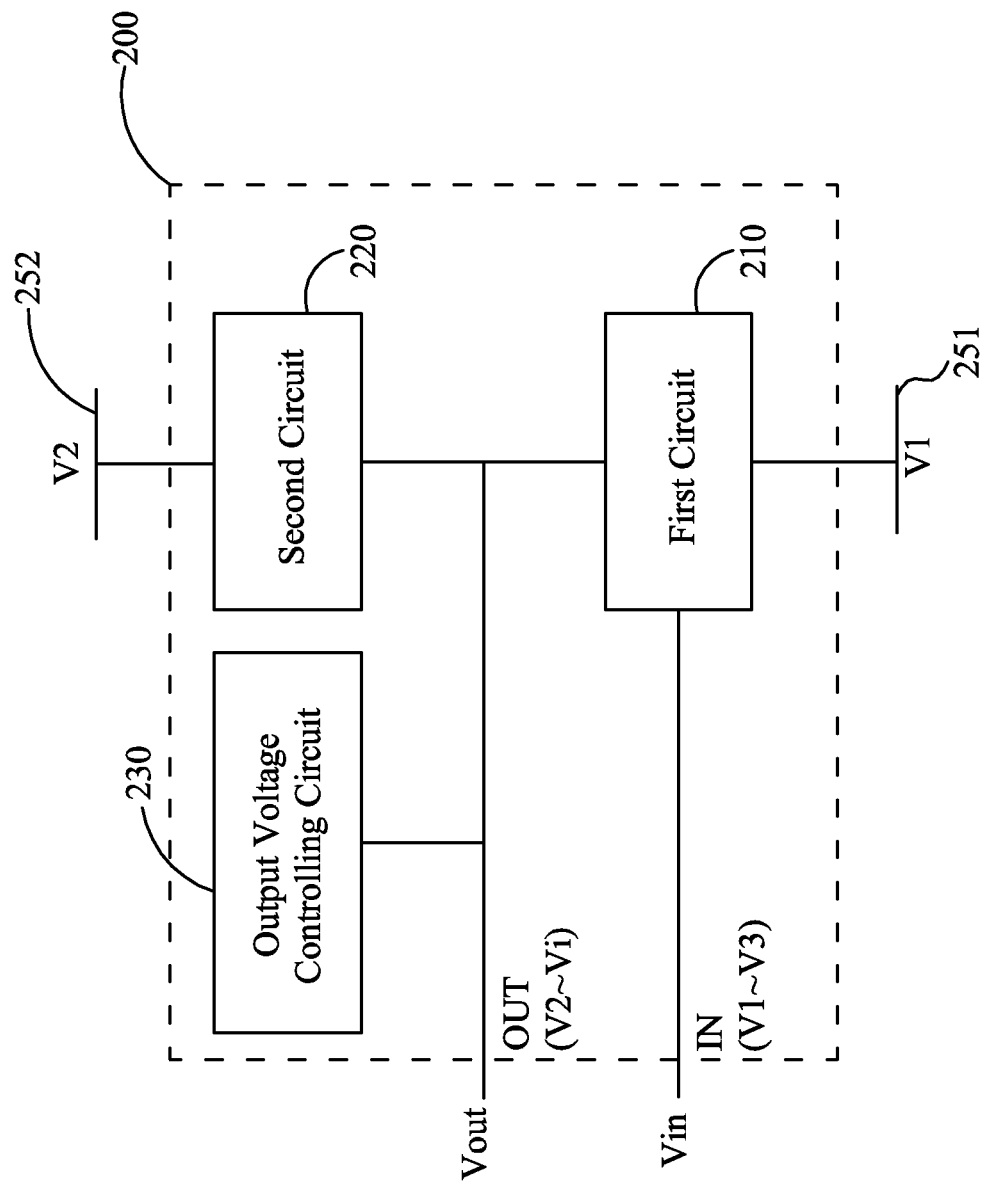
FIG. 2A is a schematic block diagram of a level shifting circuit in accordance with some embodiments.

FIG. 2A is a schematic block diagram of a level shifting circuit 200 in accordance with some embodiments. The level shifting circuit 200 includes an input node IN, an output node OUT, a first voltage node 251 for receiving a first voltage V1, and a second voltage node 252 for receiving a second voltage V2 different from the first voltage V1. The level shifting circuit 200 further includes a first circuit 210, a second circuit 220, and an output voltage controlling circuit 230.

The first circuit 210 is coupled to the input node IN, the output node OUT and the first voltage node 251. The first circuit 210 is configured for pulling an output voltage Vout at the output node OUT toward the first voltage V1 in accordance with an input voltage Vin applied to the input node IN. The second circuit 220 is coupled to the output node OUT and the second voltage node 252. The second circuit 220 is configured for pulling the output voltage Vout toward the second voltage V2 in accordance with the input voltage Vin. As a result, the output voltage Vout tends to swing over the voltage range V1-V2 from first voltage V1 to second voltage V2. Such a voltage range V1-V2 under certain circumstances unnecessarily stresses semiconductor components (e.g., transistors, interconnect features etc.) of the level shifting circuit 200. Therefore, the output voltage controlling circuit 230 is coupled to the output node OUT and configured for controlling the output voltage Vout to swing within a narrower range than the voltage range V1-V2. As a result, unnecessary stress on semiconductor components of the level shifting circuit 200 is avoided or at least reduced.

In some embodiments, the output voltage controlling circuit 230 is configured for controlling the output voltage Vout to swing between the second voltage V2 and an intermediate voltage Vi, as exemplarily illustrated in FIG. 2A. The intermediate voltage Vi is selected to be between, and different from, the first voltage V1 and the second voltage V2. In other words, V1<Vi<V2 or V1>Vi>V2. The former, i.e., V1<Vi<V2, is applicable when the level shifting circuit 200 is configured as a level up-shifting circuit which shifts the input voltage Vin, which swings within a lower voltage range between the first voltage V1 and a third voltage V3, to a higher voltage range between the second voltage V2 and the intermediate voltage Vi. The latter, i.e., V1>Vi>V2, is applicable when the level shifting circuit 200 is configured as a level down-shifting circuit which shifts the input voltage Vin, which swings within a higher voltage range between the first voltage V1 and the third voltage V3, to a lower voltage range between the second voltage V2 and the intermediate voltage Vi. In some embodiments, the intermediate voltage Vi is from about 90% to about 110% of the third voltage V3.

In some embodiments, by appropriately configuring the output voltage controlling circuit 230, the intermediate voltage Vi is pre-determined. As the first circuit 210 is coupled between the first voltage node 251 having the first voltage V1 and the output OUT having the output voltage Vout swinging in the voltage range V2-Vi, the semiconductor components of the first circuit 210 are subject to a voltage range between V1 and Vi. Similarly, as the second circuit 220 is coupled between the second voltage node 252 having the second voltage V2 and the output OUT having the output voltage Vout swinging in the voltage range V2-Vi, the semiconductor components of the first circuit 210 are subject to a voltage range between V2 and Vi. Thus, the semiconductor components of both the first circuit 210 and the second circuit 220 are subject to a narrower voltage range (i.e., V1-Vi or Vi-V2) than the full voltage range (V1-V2) to which the components would be subjected to without the output voltage controlling circuit 230. Unnecessary stress on semiconductor components of the level shifting circuit 200 is therefore avoided or at least reduced.

Figure 2B:
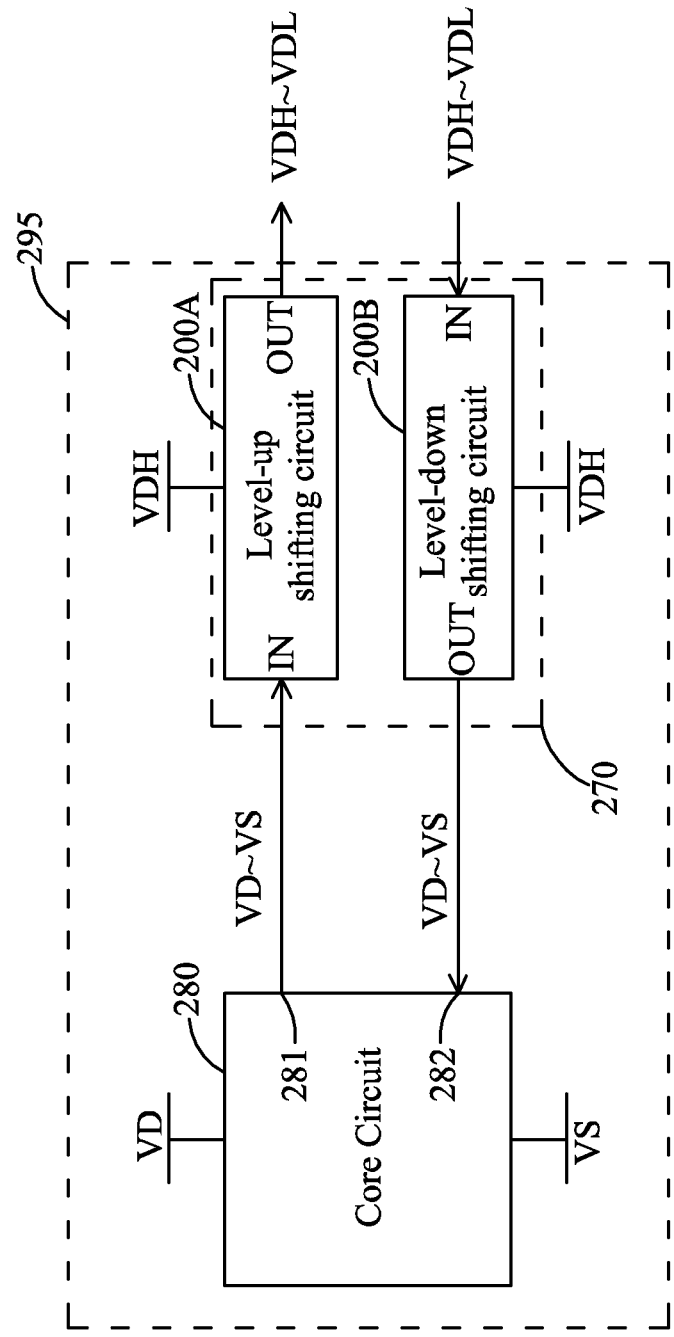
FIG. 2B is a schematic block diagram of a semiconductor device in accordance with some embodiments.

FIG. 2B is a schematic block diagram of a semiconductor device 295 in accordance with some embodiments. The semiconductor device 295 includes a core circuit 280 and an I/O circuit 270 coupled to the core circuit 280 for transferring signals between the core circuit 280 and external circuitry.

In some embodiments, the core circuit 280 includes a plurality of semiconductor components and interconnect features arranged to operate together to provide a certain function. The core circuit 280 is configured to operate within a predetermined voltage range, e.g., from the ground voltage VS to a core supply voltage VD as exemplarily illustrated in FIG. 2B. The ground voltage is not necessarily zero. In some embodiments, the ground voltage is from −10V to +10V.

The core circuit 280 is coupled to the external circuitry via the I/O circuit 270. The I/O circuit 270 includes at least one level up-shifting circuit 200A or level down-shifting circuit 200B. In some embodiments, the I/O circuit 270 includes both one or more level up-shifting circuit 200A and one or more level down-shifting circuit 200B, as exemplarily illustrated in FIG. 2B. Each level up-shifting circuit 200A or level down-shifting circuit 200B is configured as the level shifting circuit 200 described herein with respect to FIG. 2A.

One or more output(s) 281 of the core circuit 280 is/are coupled to the input IN of one or more level up-shifting circuit(s) 200A which shift(s) signals at the output(s) 281 of the core circuit 280 to a higher voltage range and output(s), at the respective output OUT, the up-shifted signals to the external circuitry. For example, the signals at the output(s) 281 of the core circuit 280 swing within a lower voltage range from the ground voltage VS to the core (first) supply voltage VD. The up-shifted signals outputted by the one or more level up-shifting circuit(s) 200A swing within a higher voltage range from an I/O (second) supply voltage VDH to an intermediate voltage VDL, where VDH>VD and VDH>VDL>VS.

Similarly, one or more input(s) 282 of the core circuit 280 is/are coupled to the output OUT of one or more level down-shifting circuit(s) 200B which shift(s) signals received from the external circuitry at the respective input IN to a lower voltage range and output(s) the down-shifted signals to the core circuit 280. For example, the signals received from the external circuitry at the input IN of the level down-shifting circuit 200B swing within a higher voltage range from an I/O (second) supply voltage VDH' to an intermediate voltage VDL'. The down-shifted signals at the input(s) 282 of the core circuit 280 swing within a lower voltage range from the ground voltage VS to the core (first) supply voltage VD, where VDH'>VD and VDH'>VDL'>VS. In some embodiments, VDH=VDH' and/or VDL=VDL'. In some embodiments, VDL and/or VDL' is from about 90% to about 110% of VD.

In some embodiments, by appropriately configuring the output voltage controlling circuit 230 (FIG. 2A) in each level up-shifting circuit 200A or level down-shifting circuit 200B, the semiconductor components of the level up-shifting circuit 200A or level down-shifting circuit 200B are subject to a voltage range which is the same as or similar to the core supply voltage range VS-VD to permit the semiconductor components, e.g., transistors, of the level up-shifting circuit 200A or level down-shifting circuit 200B to be manufactured with the same gate oxide thickness as the semiconductor components of the core circuit 280. As a result, a comparatively thicker gate oxide is not needed for the I/O circuit 270, and hence, the switching speed of the semiconductor device 295 is not affected. In addition, the manufacturing process of the I/O circuit 270 is simplified as additional processing to make the gate oxide in I/O circuit 270 thicker need not be performed. In some embodiments, the semiconductor components of the I/O circuit 270 and the core circuit 280 are manufactured at the same time and by the same processes, reducing costs and processing time. The I/O circuit 270 is thus configured to perform the intended function of interfacing between the core circuit 280 and external circuitry, which operates in a different voltage range, without over-stressing the semiconductor components of the I/O circuit 270. The intended lifespan (e.g., at least 10 years) of the semiconductor components of the I/O circuit 270 is ensured without sacrificing the semiconductor device's switching speed.

Figure 3:
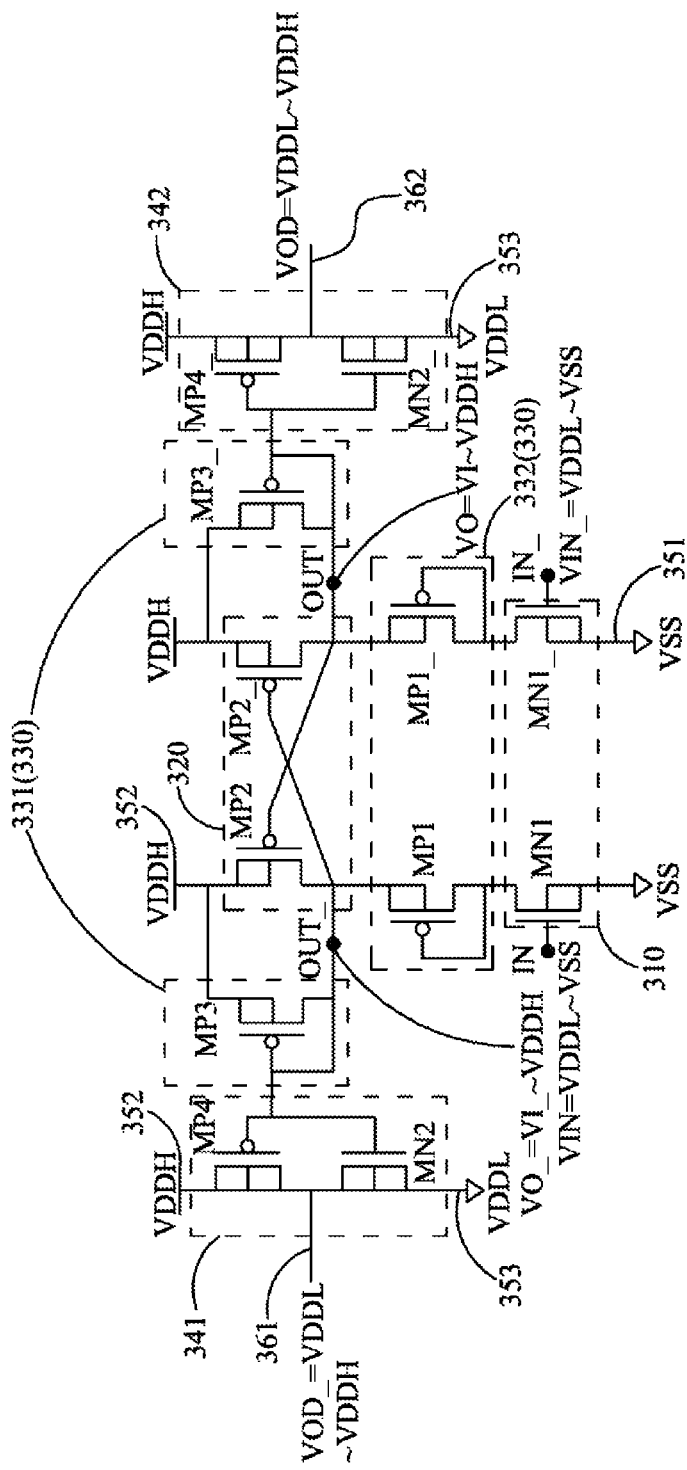
FIG. 3 is a schematic circuit diagram of a level up-shifting circuit in accordance with some embodiments.

FIG. 3 is a schematic circuit diagram of a level up-shifting circuit 300 in accordance with some embodiments. The level up-shifting circuit 300 includes a NMOS transistor MN1, a NMOS transistor MN1_, a PMOS transistor MP2, a PMOS transistor MP2_, a PMOS transistor MP3, and a PMOS transistor MP3_. The NMOS transistor MN1 and NMOS transistor MN1_ define a first circuit 310 which is arranged to perform the functions of the first circuit 210 described in FIG. 2A. The PMOS transistor MP2 and PMOS transistor MP2_ define a second circuit 320 which is arranged to perform the functions of the second circuit 220 described in FIG. 2A. The PMOS transistor MP3 and PMOS transistor MP3_ define at least a portion 331 of an output voltage controlling circuit 330 which is arranged to perform the functions of the output voltage controlling circuit 230 described in FIG. 2A.

The first circuit 310 is coupled to input nodes IN and IN_, output nodes OUT and OUT_, and a first supply voltage node 351 for pulling output voltages VO and VO_ at the output nodes OUT and OUT_ toward a first supply voltage VSS at the first supply voltage node 351, in accordance with input voltages VIN and VIN_ applied to respective input nodes IN and IN_. Specifically, the NMOS transistor MN1 has a gate coupled to the non-inverting input node IN, a drain coupled to the inverting output node OUT_, and a source coupled to the first supply voltage node 351 of the first supply voltage VSS. The NMOS transistor MN1_ has a gate coupled to the inverting input node IN_, a drain coupled to the non-inverting output node OUT, and a source coupled to the first supply voltage node 351 of the first supply voltage VSS. The first supply voltage VSS is not necessarily zero. In some embodiments, the first supply voltage VSS is from −10V to +10V.

The second circuit 320 is coupled to the output nodes OUT and OUT_, and a second supply voltage node 352 for pulling the output voltages VO and VO_ toward the second supply voltage VDDH in accordance with the input voltages VIN and VIN_. Specifically, the PMOS transistor MP2 has a gate coupled to the non-inverting output node OUT, a drain coupled to the inverting output node OUT_, and a source coupled to the second supply voltage node 352. The PMOS transistor MP2_ has a gate coupled to the inverting output node OUT_, a drain coupled to the non-inverting output node OUT, and a source coupled to the second supply voltage node 352. The PMOS transistor MP2 and PMOS transistor MP2_ are cross-latched.

The output voltage controlling circuit 330 includes at least the portion 331 which is coupled to the output nodes OUT and OUT_ for controlling the output voltages VO and VO_ within a voltage range narrower than a range VSS-VDDH from the first supply voltage VSS to the second supply voltage VDDH. Specifically, the PMOS transistor MP3 has a gate shorted to a drain thereof and also to the inverting output node OUT_, and a source coupled to the second supply voltage node 352. The PMOS transistor MP3 is diode-connected between the inverting output node OUT_ and the second supply voltage node 352. The PMOS transistor MP3_ has a gate shorted to a drain thereof and also to the non-inverting output node OUT, and a source coupled to the second supply voltage node 352. The PMOS transistor MP3_ is diode-connected between the non-inverting output node OUT and the second supply voltage node 352. The portion 331 of the output voltage controlling circuit 330 is therefore coupled between the output nodes OUT and OUT_ and the second supply voltage node 352.

The output voltage controlling circuit 330 also includes another portion 332 interposed between the output nodes OUT and OUT_ and the first circuit 310. Specifically, the PMOS transistor MP1 has a gate shorted to a drain thereof and also to the drain of the NMOS transistor MN1, and a source coupled to the inverting output node OUT_. In at least one embodiment, the PMOS transistor MP1 is diode-connected between the inverting output node OUT_ and the NMOS transistor MN1. The PMOS transistor MP1_ has a gate shorted to a drain thereof and also to the drain of the NMOS transistor MN1_, and a source coupled to the non-inverting output node OUT. In at least one embodiment, the PMOS transistor MP1_ is diode-connected between the non-inverting output node OUT and the NMOS transistor MN1_.

The level up-shifting circuit 300 also includes one or more output circuits 341, 342 coupled to the respective output nodes OUT_ and OUT, for outputting respective voltages VOD_ and VOD. Suitable circuits are implementable as the output circuits 341, 342 in various embodiments. In FIG. 3, each of the output circuits 341, 342 includes an inverter. More specifically, the inverter of output circuit 341 includes a PMOS transistor MP4 and a NMOS transistor MN2 serially coupled between the second supply voltage node 352 of the second supply voltage VDDH and a third supply voltage node 353 of a third supply voltage VDDL. Similarly, the inverter of the output circuit 342 includes a PMOS transistor MP4_ and a NMOS transistor MN2_ serially coupled between the second supply voltage node 352 of the second supply voltage VDDH and the third supply voltage node 353 of the third supply voltage VDDL. The inverters invert the output voltages VO and VO_ to generate the respective voltages VOD and VOD_. As a result, the voltages VOD and VOD_ follow the respective input voltages VIN and VIN_, but in a different (e.g., higher) voltage range, as will be described herein with respect to FIGS. 4A-4B. In some embodiments, the output circuits 341, 342 are omitted.

The input voltages VIN and VIN_ swing in the voltage range from the first supply voltage VSS to the third supply voltage VDDL. When the input voltage VIN changes from VSS to VDDL (i.e., the input voltage VIN_ changes from VDDL to VSS), the NMOS transistor MN1 is turned ON and pulls the drain thereof to VSS. Because the gate and drain of the PMOS transistor MP1 are connected to the drain of the NMOS transistor MN1, the gate of the PMOS transistor MP1 is also pulled to VSS, causing the diode-connected PMOS transistor MP1 to be turned ON. As a result, the inverting output node OUT_ is pulled via the turned-ON PMOS transistor MP1 and NMOS transistor MN1 toward VSS. Because the gate and drain of the PMOS transistor MP3 are connected to the inverting output node OUT_, the gate of the PMOS transistor MP3 is also pulled toward VSS, causing the diode-connected PMOS transistor MP3 to be turned ON. The gate of the PMOS transistor MP2_ is also connected to the inverting output node OUT_ and is pulled toward VSS, causing the PMOS transistor MP2_ to be turned ON. As a result, the non-inverting output node OUT is pulled to VDDH. The gate of the PMOS transistor MP2 is connected to the non-inverting output node OUT and is pulled toward VDDH, causing the PMOS transistor MP2 to be turned OFF. Because the gate and drain of the PMOS transistor MP3_ are connected to the non-inverting output node OUT, the gate of the PMOS transistor MP3_ is also pulled toward VDDH, causing the diode-connected PMOS transistor MP3_ to be turned OFF. The NMOS transistor MN1_ is also turned OFF due to the input voltage VIN_ at its gate changing from VDDL to VSS.

Thus, on the left side of the level up-shifting circuit 300, the PMOS transistor MP2 is turned OFF, whereas the PMOS transistor MP3, the PMOS transistor MP1 and the NMOS transistor MN1 are turned ON and connected in series between VDDH and VSS. The PMOS transistor MP1 and PMOS transistor MP3 together define a voltage divider for reducing the high voltage VDDH at the second supply voltage node 352 to an intermediate voltage VI at the inverting output node OUT_, where VDDH>VI>VSS. In some embodiments, the level of VI is determined by appropriately selecting a size ratio of the PMOS transistor MP1 to PMOS transistor MP3. For example, the size ratio of the PMOS transistor MP1 to PMOS transistor MP3 in one or more embodiments is from 1:10 to 10:1. In one or more embodiments, instead of a single PMOS transistor MP1 as illustrated in FIG. 3, several diode-connected PMOS transistors P1 are coupled in series to configure the voltage divider to provide an appropriate level of VI. Alternatively or additionally, instead of a single PMOS transistor MP3 as illustrated in FIG. 3, several diode-connected PMOS transistors P3 are coupled in series to configure the voltage divider to provide an appropriate level of VI.

On the left side of the level up-shifting circuit 300, the PMOS transistor MP2_ is turned ON, whereas the PMOS transistor MP3_ and the NMOS transistor MN1_ are turned OFF. The output voltage V0 at the non-inverting output node OUT is VDDH. The presence of the PMOS transistor MP1_ in the circuit as described is sufficient to prevent such a high voltage from being directly applied to the drain of the NMOS transistor MN1_. As a result, the NMOS transistor MN1_ is not subject to the large voltage range from VSS to VDDH.

The process is reversed when the input voltage VIN changes from VDDL to VSS (i.e., the input voltage VIN_ changes form VSS to VDDL). Specifically, on the right side of the level up-shifting circuit 300, the PMOS transistor MP2_ is turned OFF, whereas the PMOS transistor MP3_, the PMOS transistor MP1_ and the NMOS transistor MN1_ are turned ON and connected in series between VDDH and VSS. The PMOS transistor MP1_ and PMOS transistor MP3_ together define a voltage divider for reducing the high voltage VDDH at the second supply voltage node 352 to an intermediate voltage VI_ at the non-inverting output node OUT, where VDDH>VI'>VSS. In some embodiments, the level of VI_ is determined by appropriately selecting a size ratio of the PMOS transistor MP1_ to PMOS transistor MP3_. For example, the size ratio of the PMOS transistor MP1_ to PMOS transistor MP3_ in one or more embodiments is from 1:10 to 10:1. In one or more embodiments, instead of a single PMOS transistor MP1_ as illustrated in FIG. 3, several diode-connected PMOS transistors MP1_ are coupled in series to configure the voltage divider to provide an appropriate level of VI. Alternatively or additionally, instead of a single PMOS transistor MP3_ as illustrated in FIG. 3, several diode-connected PMOS transistors MP3_ are coupled in series to configure the voltage divider to provide an appropriate level of VI_.

On the left side of the level up-shifting circuit 300, the PMOS transistor MP2 is turned ON, whereas the PMOS transistor MP3 and the NMOS transistor MN1 are turned OFF. The output voltage VO_ at the inverting output node OUT_ is VDDH. The presence of the PMOS transistor MP1 in the circuit as described is sufficient to prevent such a high voltage from being directly applied to the drain of the NMOS transistor MN1. As a result, the NMOS transistor MN1 is not subject to the large voltage range from VSS to VDDH.

Accordingly, during operation of the level up-shifting circuit 300, the output voltage VO swings in a range VI-VDDH and the output voltage VO_ swings in a range VI_-VDDH. The levels of VI and VI_ are not necessarily the same. In some embodiments, at least one of VI and VI_ is from about 90% to about 110% of VDDL. In some embodiments, VI=VI_. For the sake of simplicity, the subsequent discussion will address embodiments where VI=VI_, unless otherwise noted.

The output voltages VO and VO_ swing in the voltage range VI-VDDH. This is also the voltage range applied across the PMOS transistor MP2, PMOS transistor MP3, PMOS transistor MP2_, and PMOS transistor MP3_. Because the voltage range VI-VDDH is narrower than the voltage range VSS-VDDH, over-stressing of the PMOS transistor MP2, PMOS transistor MP3, PMOS transistor MP2_, and PMOS transistor MP3_ is avoidable or at least minimizable. Likewise, the presence of the PMOS transistor MP1 and PMOS transistor MP1_ in the circuit as described together with the reduced voltage V1 (compared to VDDH) at the output nodes OUT and OUT_ protect the NMOS transistor MN1 and NMOS transistor MN1_, as well as the PMOS transistor MP1 and PMOS transistor MP1_, from being over-stressed or at least reduce the likelihood thereof.

In some embodiments, the voltage V1 is selected such that all semiconductor components (e.g., the NMOS and PMOS transistors) of the level up-shifting circuit 300 are subject to the same or similar voltage ranges that permit the semiconductor components to have the same gate oxide thickness without being over-stressed. Several particular examples will be described with respect to FIGS. 4A-4B which are various timing diagrams of voltages at certain nodes in level up-shifting circuits in accordance with some embodiments.

FIG. 4A includes various timing diagrams at the input nodes IN and IN_, the output nodes OUT and OUT_, and nodes 361, 362 of the output circuits 341, 342 of the level up-shifting circuit 300 in FIG. 3, when VDDH=2*VDD, VDDL=1*VDD and VSS=0*VDD. In some embodiments, VDD is the core supply voltage of the core circuit that generates the input voltages VIN and VIN_ that swing between VSS and VDDL (1*VDD). The output voltages VO and VO_ are inverted from the respective input voltages VIN and VIN_, and swing between VDDH (2*VDD) and VI which is from about 90% to about 110% of VDD. The voltages VOD and VOD_ at the nodes 361, 362 are inverted from the respective output voltages VO and VO_, therefore following the respective input voltages VIN and VIN_, and swing between VDDL (1*VDD) and VDDH (2*VDD). The voltages VOD and VOD_ are up-shifted signals of the respective input voltages VIN and VIN_, from a lower voltage range (VSS-VDD) to a higher voltage range (VDD-2*VDD) and are outputted to the external circuitry.

FIG. 4B includes various timing diagrams at the input nodes IN and IN_, the output nodes OUT and OUT_, and nodes 361, 362 of the output circuits 341, 342 of the level up-shifting circuit 300 in FIG. 3, when VDDH=3*VDD, VDDL=2*VDD and VSS=1*VDD. In some embodiments, a first level up-shifting circuit 300 configured to generate the signals of FIG. 4A is coupled in series to a second level up-shifting circuit 300 to enable the second level up-shifting circuit 300 to generate the signals of FIG. 4B. For example, the nodes 361, 362 of the first level up-shifting circuit 300 are coupled to the respective input nodes IN and IN_, of the second level up-shifting circuit 300 to supply the voltages VOD and VOD_ of the first level up-shifting circuit 300 as the input voltages VIN and VIN_ of the second level up-shifting circuit 300. In a manner similar to that described above with respect to 4A, the second level up-shifting circuit 300 generates voltages VOD and VOD_ which are up-shifted signals of the respective input voltages VIN and VIN_, from a lower voltage range (VDD-2*VDD) to a higher voltage range (2*VDD-3*VDD) and are outputted to the external circuitry. More than two serially connected level up-shifting circuits 300 are contemplated in further embodiments.

Figure 5:
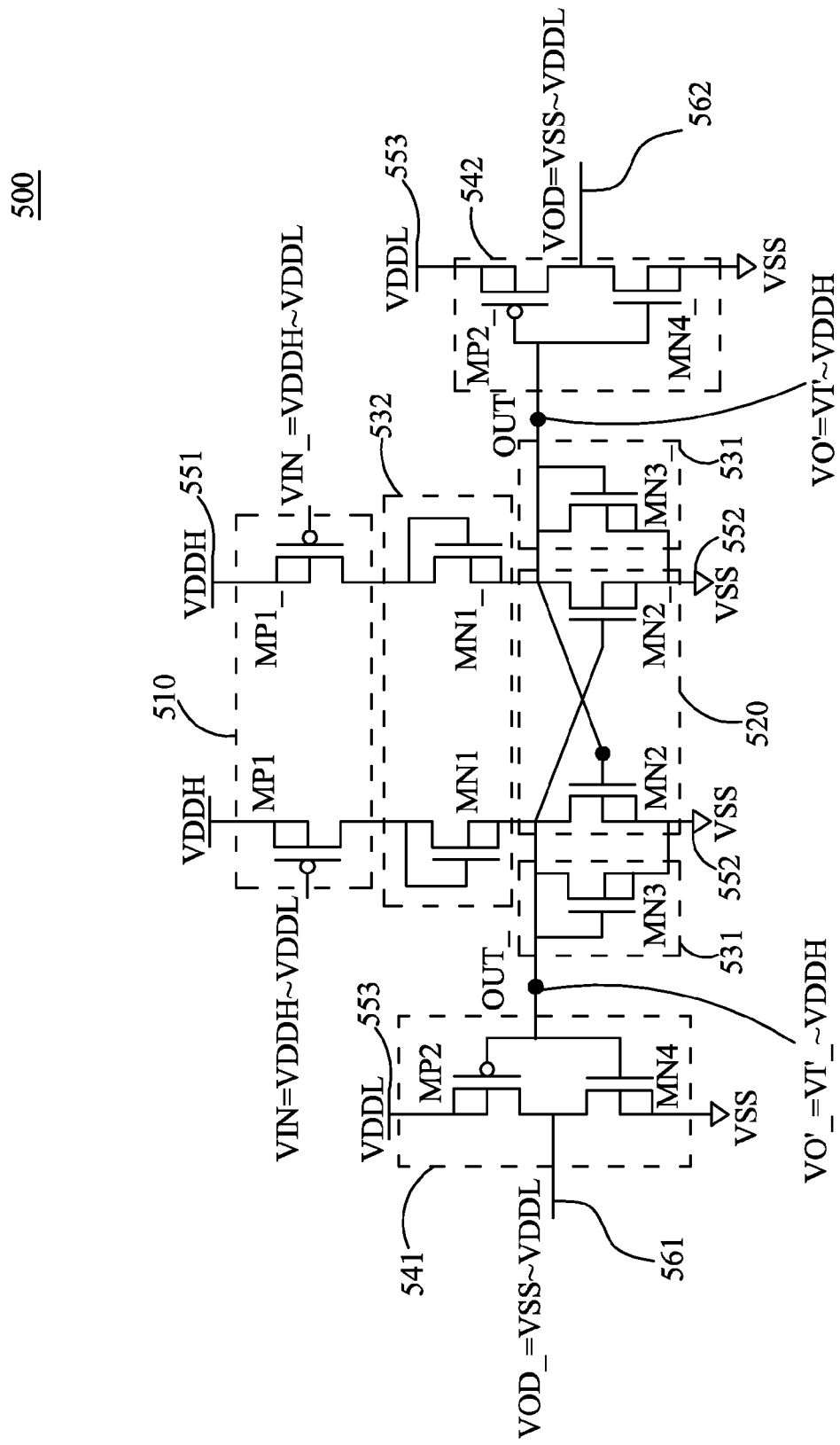
FIG. 5 is a schematic circuit diagram of a level down-shifting circuit in accordance with some embodiments.

FIG. 5 is a schematic circuit diagram of a level down-shifting circuit 500 in accordance with some embodiments. Similar elements of FIG. 5 and FIG. 3 are denoted by similar reference numerals, where the prime symbol (') is added to the reference numerals in FIG. 5 and/or the first digit "3" of the reference numerals in FIG. 3 is replaced with "5" in the corresponding reference numerals of FIG. 5. In addition, the NMOS transistors in FIG. 3 are replaced with PMOS transistors in FIG. 5, and "MN" in the respective reference numerals in FIG. 3 are changed to "MP" in the corresponding reference numerals of FIG. 5. Likewise, the PMOS transistors in FIG. 3 are replaced with NMOS transistors in FIG. 5, and "MP" in the respective reference numerals in FIG. 3 are changed to "MN" in the corresponding reference numerals of FIG. 5. The configuration and operation of the level down-shifting circuit 500 are similar to the level up-shifting circuit 300 and will not be described in detail herein.

Figure 6A:
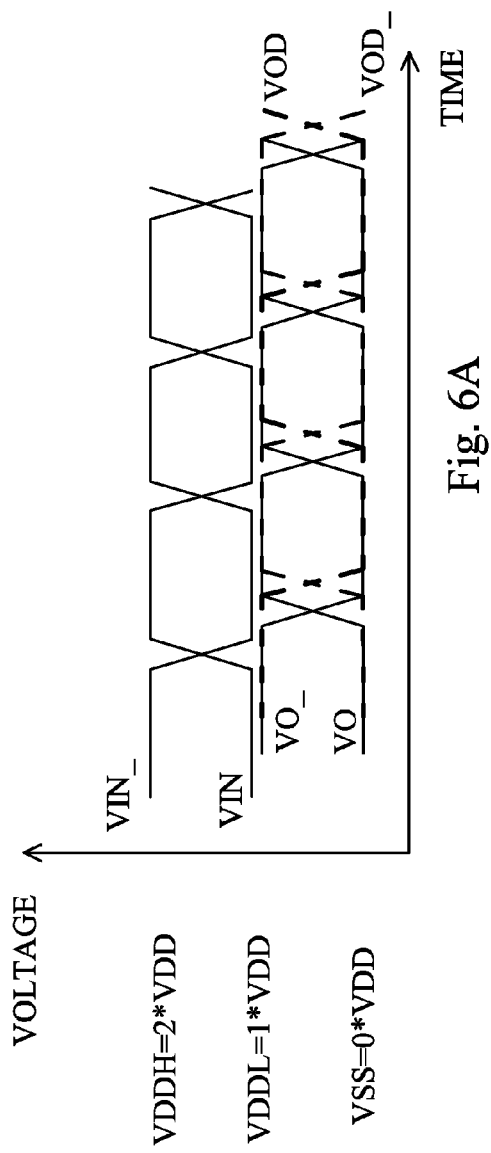
FIGS. 6A-6B are various timing diagrams of voltages at certain nodes in level down-shifting circuits in accordance with some embodiments.
Figure 6B:
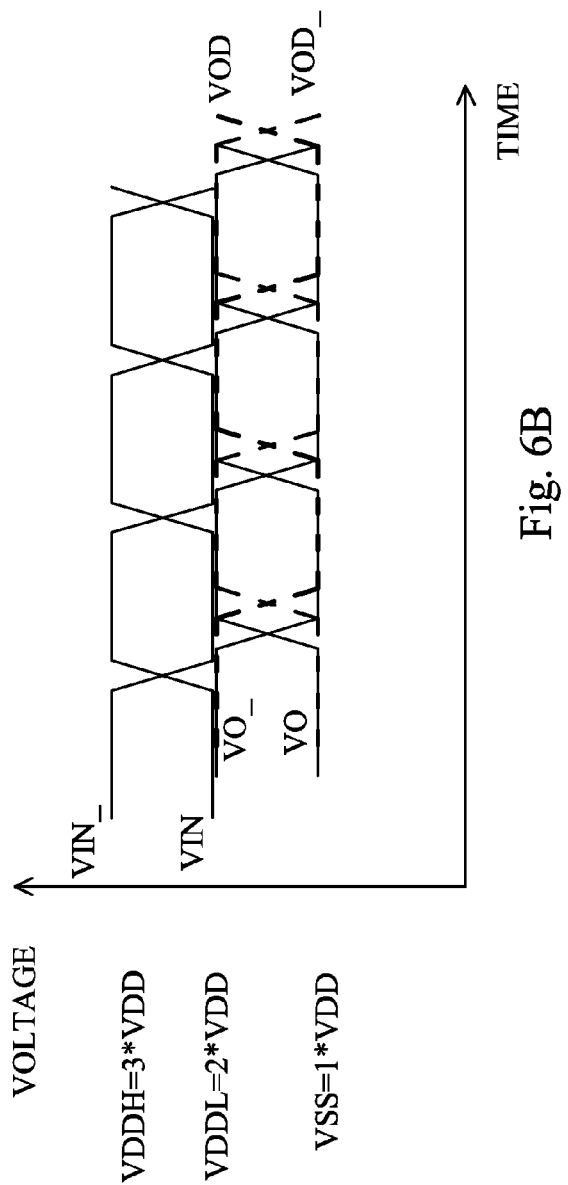

FIGS. 6A-6B are various timing diagrams of voltages at certain nodes in level down-shifting circuits in accordance with some embodiments. Similar to FIG. 4A, FIG. 6A includes various timing diagrams at the input nodes IN' and IN_', the output nodes OUT' and OUT_', and nodes 561, 562 of the output circuits 541, 542 of the level down-shifting circuit 500 in FIG. 5, when VDDH=2*VDD, VDDL=1*VDD and VSS=0*VDD. In some embodiments, VDD is the core supply voltage of the core circuit for which the input voltages VIN' and VIN_' that swing between VDDL (1*VDD) and VDDH (2*VDD) are to be down-shifted. The voltages VOD' and VOD_' are the down-shifted signals of the respective input voltages VIN' and VIN_', from a higher voltage range (VDD-2*VDD) to a lower voltage range (VSS-VDD) and are outputted to the core circuit.

Similar to FIG. 4B, FIG. 6B includes various timing diagrams at the input nodes IN' and IN_', the output nodes OUT' and OUT_', and nodes 561, 562 of the output circuits 541, 542 of the level down-shifting circuit 500 in FIG. 5, when VDDH=3*VDD, VDDL=2*VDD and VSS=1*VDD. In some embodiments, a first level down-shifting circuit 500 configured to generate the signals of FIG. 6B is coupled in series to a second level down-shifting circuit 500 to enable the second level down-shifting circuit 500 to generate the signals of FIG. 6A. For example, the nodes 561, 562 of the first level down-shifting circuit 500 are coupled to the respective input nodes IN' and IN_', of the second level down-shifting circuit 500 to supply the voltages VOD' and VOD_' of the first level down-shifting circuit 500 as the input voltages VIN and VIN_ of the second level down-shifting circuit 500. More than two serially connected level down-shifting circuits 500 are contemplated in further embodiments.

Figure 7:
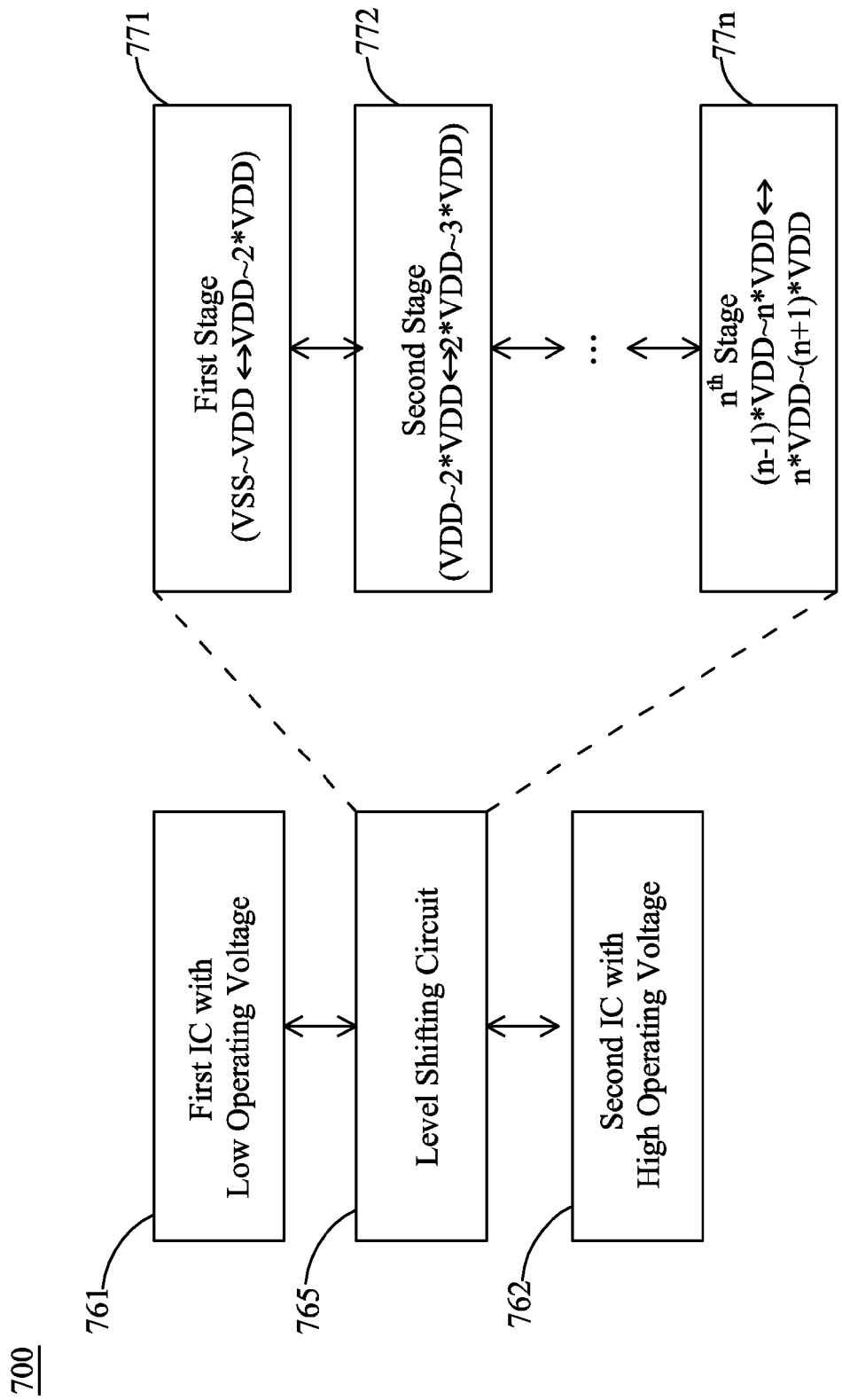
FIG. 7 is a schematic block diagram of a semiconductor device in accordance with some embodiments.

FIG. 7 is a schematic block diagram of a semiconductor device 700 in accordance with some embodiments. The semiconductor device 700 includes at least a level shifting circuit 765 for interfacing between a first IC 761 with a lower operating voltage and a second IC 762 with a higher operating voltage. In some embodiments, the semiconductor device 700 further includes at least one of the first IC 761 or the second IC 762. In some embodiments, the level shifting circuit 765 is manufactured on the same semiconductor substrate as at least one of the first IC 761 or the second IC 762. In some embodiments, the level shifting circuit 765 is provided in the same package as at least one of the first IC 761 or the second IC 762.

The level shifting circuit 765 includes a plurality of serially connected level shifting stages 771, 772, ... 77n, each for shifting signals between a lower voltage range VSS-VDD, VDD-2*VDD, ... (n−1)*VDD-n*VDD and a higher voltage range VDD-2*VDD, 2*VDD-3*VDD, ... n*VDD-(n+1)*VDD, respectively.

In some embodiments, one or more of the level shifting stages 771, 772, ... 77n, includes each at least a level up-shifting circuit as discussed with respect to FIG. 2A or FIG. 3. The serially connected level up-shifting circuits operate, in some embodiments, as discussed with respect to FIGS. 4A-4B.

In some embodiments, one or more of the level shifting stages 771, 772, ... 77n, includes each at least a level down-shifting circuit as discussed with respect to FIG. 2A or FIG. 5. The serially connected level down-shifting circuits operate, in some embodiments, as discussed with respect to FIGS. 6A-6B.

In some embodiments, one or more of the level shifting stages 771, 772, ... 77n, includes each at least a level up-shifting circuit as discussed with respect to FIG. 2A or FIG. 3 and at least a level down-shifting circuit as discussed with respect to FIG. 2A or FIG. 5. The serially connected level up-shifting circuits operate, in some embodiments, as discussed with respect to FIGS. 4A-4B, whereas the serially connected level down-shifting circuits operate, in some embodiments, as discussed with respect to FIGS. 6A-6B.

In some embodiments, the level shifting stages 771, 772, ... 77n, are identically configured to include the same circuit arrangement as described with respect to FIGS. 3 and 5. The voltages supplied to the level shifting stages 771, 772, ... 77n are different, as described with respect to FIGS. 4A-4B and/or 6A-6B.

In some embodiments, all MOS devices in each of the level shifting stages 771, 772, ... 77n have the same gate oxide thickness. In some embodiments, all MOS devices in all of the level shifting stages 771, 772, ... 77n have the same gate oxide thickness. In some embodiments, all MOS devices in at least one of the level shifting stages 771, 772, ... 77n have the same gate oxide thickness as those in the first IC 761.

Figure 8:
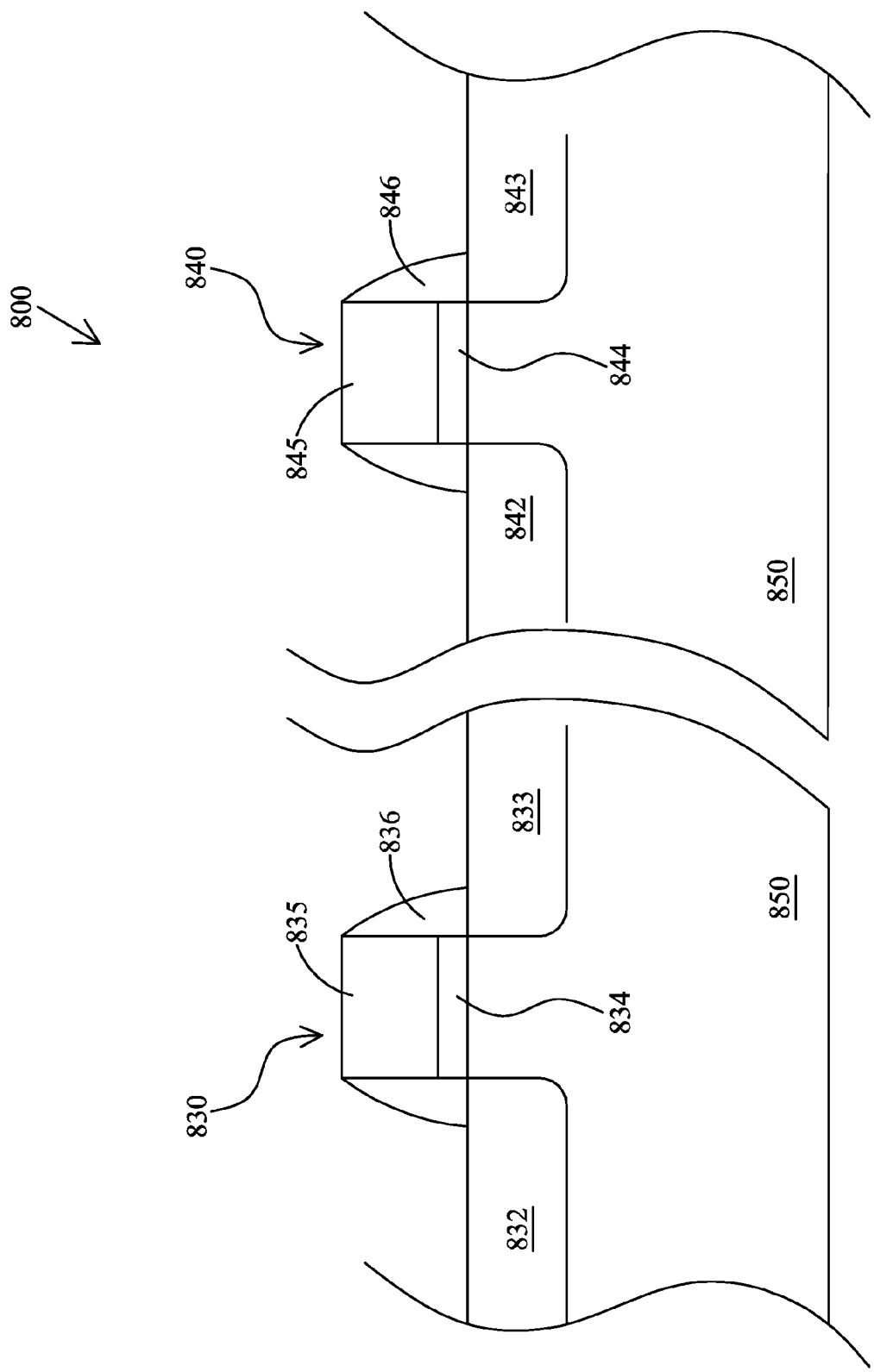
FIG. 8 is a schematic cross-sectional view of a semiconductor device in accordance with some embodiments.

FIG. 8 is a schematic cross-sectional view of a semiconductor device 800 in accordance with some embodiments. The semiconductor device 800 includes a core circuit and an I/O circuit, e.g., as described with respect to FIG. 2B or FIG. 7. A transistor 830 of the I/O circuit and a transistor 840 of the core circuit are illustrated in FIG. 8. The transistor 830 is a PMOS or NMOS transistor in a level up-shifting circuit or a level down-shifting circuit of the I/O circuit, as described with respect to FIG. 3 or FIG. 5. The transistor 840 is a PMOS or NMOS transistor in the core circuit. In some embodiments, the transistors 830 and 840 are manufactured substantially simultaneously with substantially the same technology. Specifically, the transistors 830 and 840 are formed over a semiconductor substrate 850 using any known or to be developed technologies. A gate insulation layer, also known as gate oxide layer, 834, 844 is formed over the substrate 850 for the transistors 830, 840, respectively. In some embodiments, the gate insulation layer 834 or 844 includes silicon dioxide. Gate stacks 835, 845 are formed on the gate insulation layers 834 and 844, respectively, by any known or to be developed technologies. In some embodiments, the gate stacks 834, 845 include polysilicon. Each of the transistors 830 and 840 includes doped source and drain regions 832, 833 and 842, 843, respectively, which are formed by any known or to be developed technologies. In some embodiments, spacers 836 and 846 are formed on opposite sides of the gate stacks 834, 845, respectively. The transistors 830, 840 also includes each a gate electrode, a source electrode and a drain electrode connected to the gate stack 835 or 845, the source region 832 or 833, and the drain region 842 or 843, respectively.

In some embodiments, the gate insulation layers 834 and 844 for the transistors in both the I/O circuit and the core circuit have the same thickness, thereby eliminating an additional step that would otherwise be required if one of the gate insulation layer, e.g., 834, is to be formed thicker than the other, e.g., 844.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, a level shifting circuit comprises a first circuit, a second circuit and an output voltage controlling circuit. The first circuit is coupled to an input node, an output node and a first supply voltage node and is configured to pull an output voltage at the output node toward the first supply voltage in accordance with an input voltage applied to the input node. The second circuit is coupled to the first circuit, the output node and the second supply voltage node and is configured to pull the output voltage toward the second supply voltage in accordance with the input voltage from the first circuit. The output voltage controlling circuit is coupled to the output node and is configured to control the output voltage within a range narrower than a range from the first voltage to the second voltage.

According to some embodiments, a semiconductor device comprises a core circuit and a level up-shifting circuit. The level up-shifting circuit has an input node and an output node. The input node is coupled to the core circuit and configured to receive from the core circuit an input signal swinging between a ground level voltage and a first supply voltage. The level up-shifting circuit is configured to generate, at the output node, an output signal swinging between a second supply voltage and an intermediate voltage. The second supply voltage is higher than the first supply voltage. The intermediate voltage is between, and different from, the second supply voltage and the ground level voltage. The core circuit and the level up-shifting circuit include metal-oxide-semiconductor (MOS) devices which have gate oxide layers of the same thickness.

According to some embodiments, a level shifting circuit comprises a non-inverting input node, an inverting input node, a non-inverting output node, an inverting output node, a first voltage supply node configured to receive a first supply voltage, a second voltage supply node configured to receive a second supply voltage different from the first supply voltage, and first through sixth transistors. The first transistor has a gate coupled to the non-inverting input node, and a drain and a source coupled between the first supply voltage node and the inverting output node. The second transistor has a gate coupled to the inverting input node, and a drain and a source coupled between the first supply voltage node and the non-inverting output node. The third transistor has a gate coupled to the non-inverting output node, and a drain and a source coupled between the second supply voltage node and the inverting output node. The fourth transistor has a gate coupled to the inverting output node, and a drain and a source coupled between the second supply voltage node and the non-inverting output node. The fifth transistor is diode-connected between the inverting output node and the second supply voltage node. The sixth transistor is diode-connected between the non-inverting output node and the second supply voltage node.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A level shifting circuit, comprising:
an input node;
an output node;
a first voltage node configured to receive a first voltage;
a second voltage node configured to receive a second voltage different from the first voltage;
a third voltage node configured to receive a third voltage different from the first voltage and the second voltage;
a first circuit coupled to the input node, the output node and the first voltage node and configured to pull an output voltage at the output node toward the first voltage in accordance with an input voltage applied to the input node;
a second circuit coupled to the first circuit, the output node and the second voltage node and configured to pull the output voltage toward the second voltage in accordance with the input voltage from the first circuit, the second circuit comprising a first transistor, a source of the first transistor being coupled to the second voltage node, and a drain of the first transistor being coupled to the output node;
a second transistor having a source coupled to the third voltage node and a gate coupled to the drain of the first transistor, the second transistor and the first transistor having different channel types; and
an output voltage controlling circuit coupled to the output node and configured to control the output voltage within a voltage range narrower than a range from the first voltage to the second voltage.

2. The level shifting circuit of claim 1, wherein
the output voltage controlling circuit is configured to control the output voltage to swing between the second voltage and an intermediate voltage; and
the intermediate voltage is between, and different from, the first and second voltages.

3. The level shifting circuit of claim 2, wherein
the output voltage controlling circuit is configured to control the output voltage to swing between the second voltage and the intermediate voltage, in response to the input voltage swinging between the first voltage and the third voltage, and
the intermediate voltage is from about 90% to about 110% of the third voltage.

4. The level shifting circuit of claim 2, wherein the output voltage controlling circuit includes
a third transistor coupled between the output node and the first circuit, and
a fourth transistor coupled between the second voltage and the output node, wherein the intermediate voltage is related to a size ratio of the third transistor to the fourth transistor.

5. The level shifting circuit of claim 1, wherein
at least a portion of the output voltage controlling circuit is coupled between the output node and the first circuit.

6. The level shifting circuit of claim 1, wherein
at least a portion of the output voltage controlling circuit is coupled between the second voltage node and the output node.

7. A level shifting circuit, comprising:
a non-inverting input node and an inverting input node;
a non-inverting output node and an inverting output node;
a first voltage supply node configured to receive a first supply voltage;
a second voltage supply node configured to receive a second supply voltage different from the first supply voltage;

a third voltage supply node configured to receive a third supply voltage different from the first supply voltage and the second supply voltage;
a first transistor having
 a gate coupled to the non-inverting input node, and
 a drain and a source coupled between the first supply voltage node and the inverting output node;
a second transistor having
 a gate coupled to the inverting input node, and
 a drain and a source coupled between the first supply voltage node and the non-inverting output node;
a third transistor having
 a gate coupled to the non-inverting output node, and
 a drain and a source coupled between the second supply voltage node and the inverting output node;
a fourth transistor having
 a gate coupled to the inverting output node, and
 a drain and a source coupled between the second supply voltage node and the non-inverting output node;
a diode-connected fifth transistor coupled between the inverting output node and the second supply voltage node;
a diode-connected sixth transistor coupled between the non-inverting output node and the second supply voltage node; and
a seventh transistor having
 a gate coupled to the drain of the fourth transistor,
 a source coupled to the third supply voltage node, and
 the seventh transistor and the fourth transistor having different channel types.

8. The level shifting circuit of claim 7, further comprising
a diode-connected eighth transistor coupled between the inverting output node and the first transistor; and
a diode-connected ninth transistor coupled between the non-inverting output node and the second transistor.

9. The level shifting circuit of claim 8, wherein
the level shifting circuit is a level-up shifting circuit,
the first, second, and seventh transistors are n-channel metal-oxide semiconductor (NMOS) transistors, and
the third through sixth, eighth, and ninth transistors are p-channel metal-oxide semiconductor (PMOS) transistors.

10. The level shifting circuit of claim 8, wherein
the level shifting circuit is a level-down shifting circuit,
the first, second, and seventh transistors are PMOS transistors, and
the third through sixth, eighth, and ninth transistors are NMOS transistors.

11. The level shifting circuit of claim 8, wherein
the first through ninth transistors are metal-oxide-semiconductor (MOS) transistors, and
a size ratio of the eighth transistor to the fifth transistor and a size ratio of the ninth transistor to the sixth transistor are from 10:1 to 1:10.

12. The level shifting circuit of claim 11, wherein
the first through ninth MOS transistors have gate oxide layers of the same thickness.

13. The level shifting circuit of claim 7, wherein
the level shifting circuit is a level up-shifting circuit,
the first and second transistors are n-channel metal-oxide semiconductor (NMOS) transistors, and
the third through sixth transistors are p-channel metal-oxide semiconductor (PMOS) transistors.

14. The level shifting circuit of claim 7, wherein
the level shifting circuit is a level down-shifting circuit,
the first and second transistors are PMOS transistors, and
the third through sixth transistors are NMOS transistors.

15. A level shifting circuit, comprising:
a first transistor of a first type comprising a gate, a source, and a drain, the source of the first transistor of the first type coupled to a first supply node, and the gate of the first transistor of the first type configured to receive a first input signal;
a second transistor of the first type comprising a gate, a source, and a drain, the source of the second transistor of the first type coupled to the first supply node, and the gate of the second transistor of the first type configured to receive a second input signal;
a first transistor of a second type comprising a gate, a source, and a drain, the source of the first transistor of the second type coupled to a second supply node;
a second transistor of the second type comprising a gate, a source, and a drain, the source of the second transistor of the second type coupled to the second supply node, the gate of the second transistor of the second type coupled to the drain of the first transistor of the second type, and the drain of second transistor of the second type coupled to the gate of the first transistor of the second type;
a third transistor of the first type comprising a gate, a source, and a drain, the source of the third transistor of the first type coupled to a third supply node, and the gate of the third transistor of the first type coupled to the drain of the first transistor of the second type;
a first diode coupled between the drain of the first transistor of the first type and the drain of the first transistor of the second type; and
a second diode coupled between the drain of the second transistor of the first type and the drain of the second transistor of the second type.

16. The level shifting circuit of claim 15, further comprising:
a first inverter, comprising the third transistor of the first type, coupled between the second supply node and the third supply node, a voltage level at the third supply node being between those of the first and second supply nodes, and an input terminal of the first inverter coupled to the drain of the first transistor of the second type; and
a second inverter coupled between the second supply node and the third supply node, and an input terminal of the second inverter coupled to the drain of the second transistor of the second type.

17. The level shifting circuit of claim 15, further comprising:
a third diode coupled between the drain of the first transistor of the second type and the second supply node; and
a fourth diode coupled between the drain of the second transistor of the second type and the second supply node.

18. The level shifting circuit of claim 17, wherein the first, second, third, and fourth diodes are diode connected transistors of the same type.

19. The level shifting circuit of claim 18, wherein a size ratio of the first diode to the third diode or a size ratio of the second diode to the fourth diode ranges from 10:1 to 1:10.

20. The level shifting circuit of claim 15, wherein
the first and second transistors of the first type are n-channel metal-oxide semiconductor (NMOS) transistors, and
the first and second transistors of the second type are p-channel metal-oxide semiconductor (PMOS) transistors.

* * * * *